(12) United States Patent
Akiyama et al.

(10) Patent No.: US 9,335,371 B2
(45) Date of Patent: May 10, 2016

(54) SEMICONDUCTOR EVALUATING DEVICE AND SEMICONDUCTOR EVALUATING METHOD

(71) Applicant: MITSUBISHI ELECTRIC CORPORATION, Tokyo (JP)

(72) Inventors: Hajime Akiyama, Tokyo (JP); Akira Okada, Tokyo (JP); Kinya Yamashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 175 days.

(21) Appl. No.: 14/065,064

(22) Filed: Oct. 28, 2013

(65) Prior Publication Data
US 2014/0210500 A1    Jul. 31, 2014

(30) Foreign Application Priority Data

Jan. 28, 2013   (JP) .................................. 2013-013046

(51) Int. Cl.
*G01R 31/12*    (2006.01)
*G01R 31/28*    (2006.01)

(52) U.S. Cl.
CPC .................................. *G01R 31/2886* (2013.01)

(58) Field of Classification Search
CPC .... G01R 31/12; G01R 31/26; G01R 31/2886; G01R 31/2601; G01R 5/28; H01L 21/67
See application file for complete search history.

(56) References Cited

U.S. PATENT DOCUMENTS

| 6,248,169 | B1 * | 6/2001 | Juang et al. ...................... 118/52 |
| 6,741,445 | B1 * | 5/2004 | Phan et al. ...................... 361/230 |
| 8,610,446 | B2 | 12/2013 | Yoshida et al. |
| 2005/0000549 | A1 * | 1/2005 | Oikari et al. .................. 134/25.4 |
| 2007/0247177 | A1 | 10/2007 | Ruckenbauer |
| 2008/0049218 | A1 | 2/2008 | Kido |
| 2011/0017134 | A1 * | 1/2011 | Tanioka et al. ............... 118/629 |
| 2011/0309850 | A1 | 12/2011 | Yoshida et al. |
| 2013/0229188 | A1 * | 9/2013 | Seymour et al. .............. 324/501 |

FOREIGN PATENT DOCUMENTS

| CN | 1536636 A | 10/2004 |
| CN | 101113957 A | 1/2008 |
| JP | S61-065174 A | 4/1986 |
| JP | H03-022454 A | 1/1991 |
| JP | 10-096746 A | 4/1998 |

(Continued)

OTHER PUBLICATIONS

An Office Action; "Notification of Reason(s) for Refusal," issued by the Japanese Patent Office on Mar. 1, 2016, which corresponds to Japanese Patent Application No. 2013-013046 and is related to U.S. Appl. No. 14/065,064; with English language translation.

The First Office Action issued by the Chinese Patent Office on Jan. 21, 2016, which corresponds to Chinese Patent Application No. 201410042200.3 and is related to U.S. Appl. No. 14/065,064; with English language translation.

*Primary Examiner* — Son Le
(74) *Attorney, Agent, or Firm* — Studebaker & Brackett PC

(57) ABSTRACT

A semiconductor evaluating device includes a chuck stage for holding a semiconductor device serving as a measuring object, a contact probe for evaluating an electrical characteristic of the semiconductor device by getting contact with the semiconductor device held on the chuck stage, and a fluid spraying portion for spraying a fluid onto the semiconductor device.

19 Claims, 7 Drawing Sheets

(56) References Cited

FOREIGN PATENT DOCUMENTS

| JP | H10-319075 A | 12/1998 |
| JP | 2000-164648 A | 6/2000 |
| JP | 2002-022770 A | 1/2002 |
| JP | 2003-130889 A | 5/2003 |
| JP | 2003130889 A * | 5/2003 | ............ G01R 1/06 |
| JP | 2004-111442 A | 4/2004 |
| JP | 2005-030829 A | 2/2005 |
| JP | 2006-337359 A | 12/2006 |
| JP | 2011-252792 A | 12/2011 |

* cited by examiner

F I G . 7
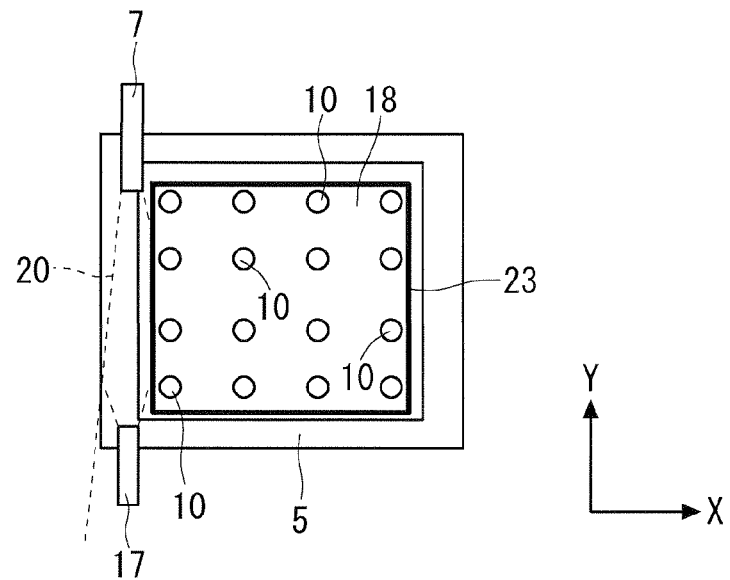
F I G . 8
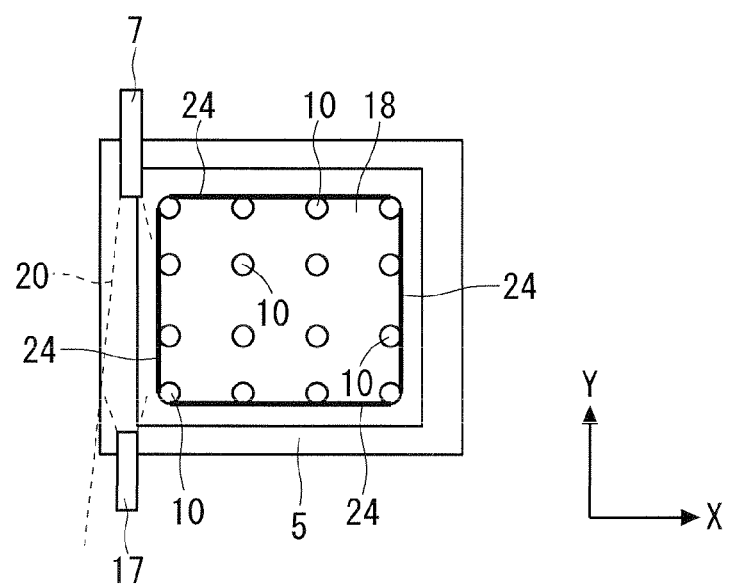

SEMICONDUCTOR EVALUATING DEVICE AND SEMICONDUCTOR EVALUATING METHOD

BACKGROUND OF THE INVENTION

1. Field of the Invention

The present invention relates to a semiconductor evaluating device and a semiconductor evaluating method which execute evaluation for an electrical characteristic of a measuring object in a state in which a fluid is sprayed onto the measuring object.

2. Description of the Background Art

When the electrical characteristic of a semiconductor device (a measuring object) in a semiconductor wafer state or in a semiconductor chip state is to be evaluated, a surface where the measuring object is to be provided is fixed by vacuum adsorption or the like in a state where the surface thereof is in contact with a surface of a chuck stage, and a contact prober is then caused to come in contact with a front surface of the measuring object in order to carry out electrical input/output. Moreover, the number of pins in the contact probe has been increased by a request for applying a large current or a high voltage, or the like.

Under the circumstances, it is known that a partial discharge phenomenon occurs between the contact probe and the measuring object, for example, and partial breakage or malfunction of the measuring object is thus caused during the evaluation for the measuring object. For this reason, it is important to suppress the partial discharge. In the case where the measuring object having the partial discharge occurring is drained away as a good product into a subsequent step, it is very hard to extract the measuring object in the subsequent step. For this reason, it is desirable to take measures for suppressing the partial discharge in advance. Therefore, the technique for suppressing the partial discharge is disclosed in Japanese Patent Application Laid-Open Nos. 2003-130889 and 10-96746 (1998), for example.

The Japanese Patent Application Laid-Open No. 2003-130889 describes the technique for inspecting the characteristic of an electronic component in an insulating liquid, thereby preventing a discharge from occurring during the characteristic inspection. Moreover, the Japanese Patent Application Laid-Open No. 10-96746 (1998) describes the technique for executing the characteristic inspection for a thing to be inspected in a closed space filled with an inert gas without using the insulating liquid, thereby preventing the discharge from occurring during the characteristic inspection.

However, the technique described in the Japanese Patent Application Laid-Open No. 2003-130889 has a problem in that an expensive prober is necessary, and furthermore, a time required for the evaluating step is increased and a cost cannot be reduced because of the evaluation in the liquid. In the case where the measuring object is a semiconductor element in a wafer test and a chip test, moreover, it is necessary to perfectly remove the insulating liquid from the semiconductor element after the evaluation. For this reason, it is difficult to apply the evaluating method.

The technique described in the Japanese Patent Application Laid-Open No. 10-96746 (1998) has a problem in that it is not suitable for reduction in cost because the inspection is carried out in the closed space filled with the inert gas without the insulating liquid used and the structure of the evaluating device is complicated and a problem in that a time required for the evaluating step is increased because it is necessary to fill the closed space with the inert gas every time the thing to be inspected is exchanged.

SUMMARY OF THE INVENTION

It is an object of the present invention to provide a semiconductor evaluating device and a semiconductor evaluating method in which an occurrence of a partial discharge in a measuring object can be easily prevented at a low cost without increasing a time required for an evaluating process.

A semiconductor evaluating device according to the present invention includes a chuck stage for holding a measuring object, a contact probe for evaluating an electrical characteristic of the measuring object held on the chuck stage in contact with the measuring object, and a fluid spraying portion for spraying a fluid onto the measuring object.

The semiconductor evaluating device according to the present invention includes the chuck stage for holding a measuring object, the contact probe for evaluating an electrical characteristic of the measuring object held on the chuck stage in contact with the measuring object, and the fluid spraying portion for spraying a fluid onto the measuring object.

When the electrical characteristic of the measuring object is to be evaluated by the contact probe, therefore, the fluid is sprayed onto the measuring object by the fluid spraying portion. Consequently, it is possible to easily prevent the partial discharge from occurring in the evaluation.

It is sufficient that the fluid is sprayed onto the measuring object. For this reason, it is not necessary to tightly seal a measurement space in which the contact probe and the measuring object are disposed. Moreover, there is not required additional processing for filling with the fluid every evaluation or removing the fluid from the measuring object after the evaluation. Therefore, it is possible to reduce a cost and to prevent a time required for an evaluating process from being increased.

A semiconductor evaluating method according to the present invention includes the steps of electrically evaluating the measuring object by causing the contact probe to come in contact with the measuring object, and spraying a fluid onto a front surface of the measuring object by the fluid spraying portion in the step of electrically evaluating the measuring object.

The semiconductor evaluating method according to the present invention includes the steps of electrically evaluating the measuring object by causing the contact probe to come in contact with the measuring object, and spraying a fluid onto a front surface of the measuring object by the fluid spraying portion in the step of electrically evaluating the measuring object.

When the electrical characteristic of the measuring object is to be evaluated by the contact probe, therefore, the fluid is sprayed onto the measuring object by the fluid spraying portion. Consequently, it is possible to easily prevent the partial discharge from occurring in the evaluation.

It is sufficient that the fluid is sprayed onto the measuring object. For this reason, it is not necessary to tightly seal a measurement space in which the contact probe and the measuring object are disposed. Moreover, there is not required additional processing for filling with a fluid every evaluation or removing the fluid from the measuring object after the evaluation. Therefore, it is possible to reduce a cost and to prevent a time required for an evaluating process from being increased.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a plan view showing a structure in which a fluid spraying portion and a fluid sucking portion are disposed in a semiconductor evaluating device according to a fourth variant of the first preferred embodiment;

FIG. 8 is a plan view showing a structure in which a fluid spraying portion and a fluid sucking portion are disposed in a semiconductor evaluating device according to a fifth variant of the first preferred embodiment;

DESCRIPTION OF THE PREFERRED EMBODIMENTS

First Embodiment

Figure 1:
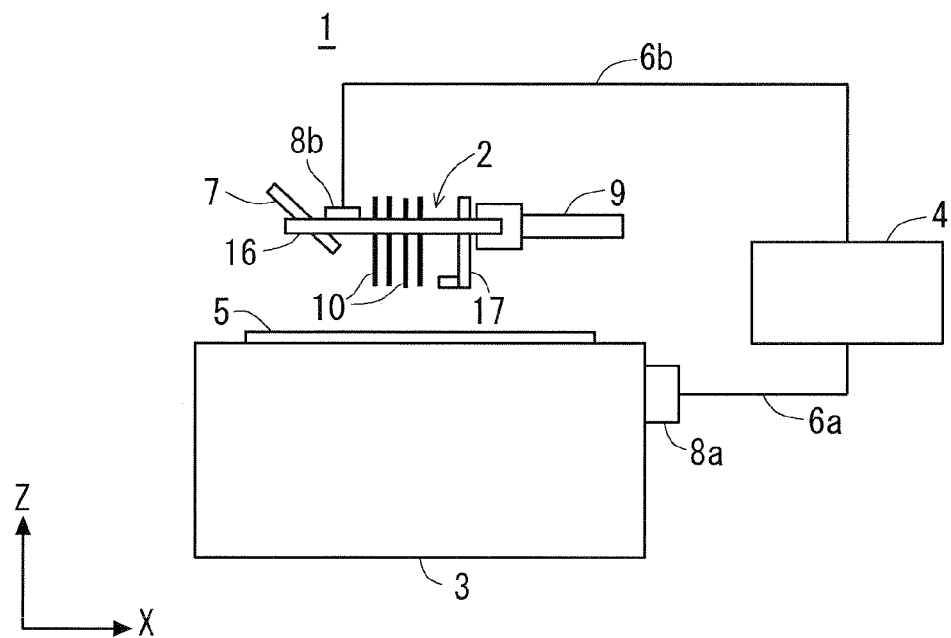
FIG. 1 is a schematic view showing a semiconductor evaluating device according to a first preferred embodiment.

A first preferred embodiment according to the present invention will be described below with reference to the drawings. FIG. 1 is a schematic view showing a semiconductor evaluating device 1 according to the first preferred embodiment. The semiconductor evaluating device 1 includes a probe substrate 2, a chuck stage 3, a control unit 4, a fluid spraying portion 7, a fluid sucking portion 17, and a moving arm 9.

The probe substrate 2 includes a contact probe 10, an insulating substrate 16 and a connecting portion 8b. In the first preferred embodiment, the fluid spraying portion 7 and the fluid sucking portion 17 are provided on the insulating substrate 16, and an electrical characteristic of a semiconductor device 5 is evaluated in a state in which a fluid is sprayed onto a surface of the semiconductor device 5.

Although the semiconductor device 5 having a longitudinal structure for causing a large current to flow in a longitudinal direction of the semiconductor device 5, that is, an out-of-plane direction is shown as an example in the first preferred embodiment, the present invention is not restricted thereto but it is also possible to employ a semiconductor device having a horizontal structure which carries out input/output in one of surfaces of the semiconductor device. In the evaluation for the semiconductor device 5 having the longitudinal structure, one of electrodes for connection to an outside is the contact probe 10 which comes in contact with a connecting pad 18 (see FIG. 2) provided on an upper surface of the semiconductor device 5. The other electrode is a lower surface of the semiconductor device 5, that is, an upper surface of the chuck stage 3 to come in contact at an installation surface.

The contact probe 10 is fixed to the insulating substrate 16 and is connected to the control unit 4 through a signal line 6b connected to the connecting portion 8b of the insulating substrate 16. The chuck stage 3 is connected to the control unit 4 through a signal line 6a connected to a connecting portion 8a provided on a side surface of the chuck stage 3.

The plurality of contact probes 10 are provided on the assumption that a large current is applied. It is desirable that the respective connecting portions 8a and 8b should be provided in positions in which a distance from each of the contact probes 10 to the connecting portion 8b to be a connecting position for the signal line 6b and the insulating substrate 16 and a distance from each of the contact probes 10 to the connecting portion 8a provided on the side surface of the chuck stage 3 are almost coincident with each other through any of the contact probes 10 in such a manner that current densities to be applied to the respective contact probes 10 are almost equal to each other. In other words, it is desirable that the connecting portion 8a and the connecting portion 8b should be placed in opposed positions to each other through the contact probe 10. Moreover, each of the contact probes 10 and the connecting portion 8b are connected to each other through a metal plate (not shown) which is provided on the insulating substrate 16, for example.

The probe substrate 2 is held movably in an optional direction by means of the moving arm 9. Although there is employed the structure in which the probe substrate 2 is held by means of only one moving arm 9, the present invention is not restricted thereto but the probe substrate 2 may be held stably by means of a plurality of moving arms. Moreover, the moving arm 9 may have a structure in which the chuck stage 3 is held movably to move the semiconductor device 5, that is, the chuck stage 3 side in place of the probe substrate 2. The chuck stage 3 is a seat for fixing (holding) the semiconductor device 5 in contact with an installation surface of the semiconductor device 5, and has a function of vacuum adsorption as means for fixing the semiconductor device 5, for example. The means for fixing the semiconductor device 5 is not restricted to the vacuum adsorption but may be electrostatic adsorption or the like.

Figure 2:
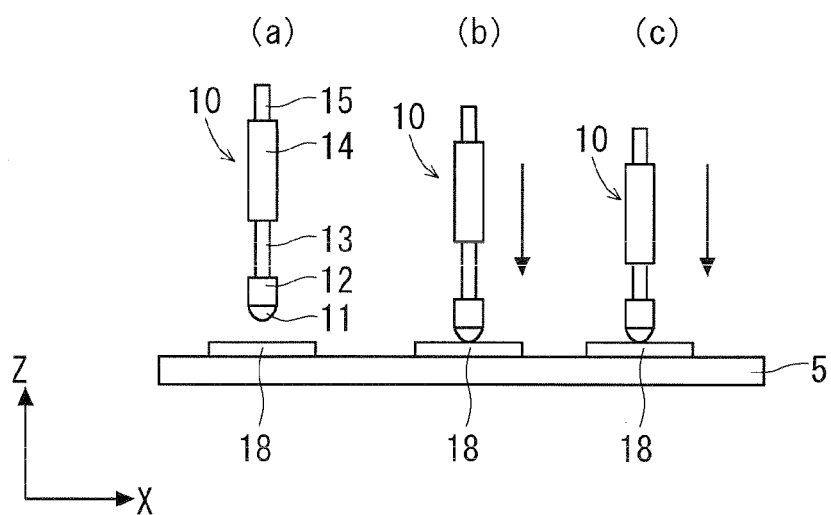
FIG. 2 is a view for explaining an operation of a contact probe in the semiconductor evaluating device according to the first preferred embodiment.

Next, the contact probe 10 will be described. FIG. 2 is a view for explaining an operation of the contact probe 10 in the semiconductor evaluating device 1 according to the first preferred embodiment, and part (a) of FIG. 2 shows an initial state, part (b) of FIG. 2 shows a contact state and part (c) of FIG. 2 shows a pressing state.

The contact probe 10 is formed as a base and is fixed to the insulating substrate 16 in a downward direction (in a −Z direction). The contact probe 10 includes an installing portion 14 to be fixed to the insulating substrate 16, a tip portion 12 having a contact portion 11 to mechanically and electrically come in contact with the connecting pad 18 provided on the upper surface of the semiconductor device 5, a push-in portion 13 which is slidable in contact through a spring member such as a spring incorporated into an inner part, and an electrical connecting portion 15 which is electrically conducted to the tip portion 12 and serves as an output terminal to an outside.

Although the contact probe 10 is formed by a metallic material such as copper, tungsten or rhenium tungsten which has an electrical conductivity, the present invention is not restricted thereto but the contact portion 11 may be particularly covered with another member, for example, gold, palladium, tantalum, platinum or the like in respect of enhancement in electrical conductivity, improvement in durability and the like.

When the contact probe 10 is moved down toward the connecting pad 18 (in the −Z direction) provided on the surface of the semiconductor device 5 in the initial state shown in part (a) of FIG. 2, the connecting pad 18 and the contact portion 11 first come in contact with each other as shown in part (b) of FIG. 2. When the contact probe 10 is further moved downward, then, the push-in portion 13 is pushed into the installing portion 14 through the spring member as shown in part (c) of FIG. 2. Consequently, the contact of the semiconductor device 5 with the connecting pad 18 is made reliable.

Figure 3:
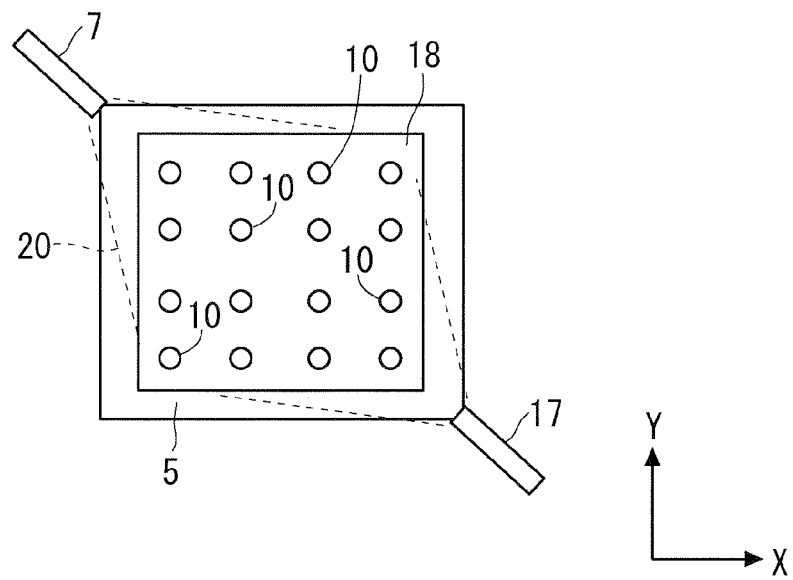
FIG. 3 is a plan view showing a structure in which a fluid spraying portion and a fluid sucking portion are disposed in the semiconductor evaluating device according to the first preferred embodiment.

With reference to FIG. 3, next, description will be given to an example in which the fluid spraying portion 7 and the fluid sucking portion 17 are disposed on the insulating substrate 16. As a fluid to be sprayed from the fluid spraying portion 7, it is desirable to use a gas which is thermally and chemically stable, is excellent in insulating performance and has a low ionizing property. More specifically, although the gas includes a sulfur hexafluoride gas, a carbon dioxide gas, a nitrogen gas and the like, the present invention is not restricted thereto. In particular, the sulfur hexafluoride gas is also known as an excellent arc-extinguishing medium and is utilized in a buffer type gas blast circuit breaker. By evaluating the electrical characteristic in a state in which the fluid having the property described above is sprayed, that is, a state in which an atmospheric concentration of the fluid is high, it is possible to prevent a partial discharge from occurring in the vicinity of the front surface of the semiconductor device 5.

FIG. 3 is a plan view showing a structure in which the fluid spraying portion 7 and the fluid sucking portion 17 are disposed in the semiconductor evaluating device 1, and the insulating substrate 16 is omitted for easy understanding of the drawing. The single fluid spraying portion 7 is provided in an inclining state with respect to a vertical direction (to a Z direction), for example, in a corresponding position to an almost center of a single corner portion of the semiconductor device 5 in the insulating substrate 16, and a fluid 20 is sprayed onto the whole front surface of the semiconductor device 5 by the fluid spraying portion 7.

The single fluid sucking portion 17 is provided in a corresponding position to an almost center of a corner portion which is opposed to the corner portion of the semiconductor device 5 in which the fluid spraying portion 7 is disposed in the insulating substrate 16, and the fluid 20 sprayed onto the semiconductor device 5 is sucked by the fluid sucking portion 17. The fluid sucking portion 17 is disposed in order to suppress pressurization of a measurement space which is limited in the semiconductor evaluating device 1 and to prevent the fluid 20 from scattering.

For example, the fluid spraying portion 7 is connected to a fluid supplying portion (not shown) through a fluid outlet pipe (not shown), and furthermore, the fluid sucking portion 17 is connected to the fluid supplying portion through a fluid inlet pipe (not shown) so that the fluid supplying portion is controlled by the control unit 4. The control unit 4 controls the fluid supplying portion so as to start the evaluation for the electrical characteristic of the semiconductor device 5, and at the same time, to start the supply of the fluid 20 from the fluid supplying portion to the fluid spraying portion 7 through the fluid outlet pipe and to start the suction of the fluid 20 by the fluid sucking portion 17.

Next, description will be given to a procedure for the operation of the semiconductor evaluating device 1 according to the first preferred embodiment. Since the plurality of contact probes 10 are provided, a parallelism of the contact portion 11 in each of the contact probes 10 is made uniform before the evaluation. The semiconductor device 5 is fixed onto the chuck stage 3 in such a manner that the installation surface of the semiconductor device 5 comes in contact with the chuck stage 3. Although a semiconductor wafer having a plurality of semiconductor chips formed thereon or the semiconductor chip itself is proposed as the semiconductor device 5, for example, the present invention is not restricted thereto but the semiconductor device 5 to be fixed by vacuum adsorption or the like is preferable.

After the semiconductor device 5 is fixed onto the chuck stage 3, the contact probe 10 is caused to come in contact with the semiconductor device 5 through the connecting pad 18. Then, evaluation related to a desirable electrical characteristic is executed. The control unit 4 sprays the fluid 20 onto the front surface of the semiconductor device 5 by the fluid spraying portion 7, and furthermore, sucks the sprayed fluid 20 by the fluid sucking portion 17 simultaneously with the start of the evaluation. Consequently, it is possible to maintain a state in which the atmospheric concentration of the fluid 20 is high in the vicinity of the front surface of the semiconductor device 5 during the evaluation. The control unit 4 ends the spraying and suction of the fluid 20 simultaneously with the end of the evaluation. Since the evaluation is executed in the state in which the atmospheric concentration of the fluid 20 is high, it is possible to effectively prevent a partial discharge from occurring in the vicinity of the front surface of the semiconductor device 5.

As described above, the semiconductor evaluating device 1 according to the first preferred embodiment includes the chuck stage 3 for fixing the semiconductor device 5 which is the measuring object, the contact probe 10 for evaluating the electrical characteristic of the semiconductor device 5 by getting contact with the semiconductor device 5 fixed onto the chuck stage 3 through the connecting pad 18, and the fluid spraying portion 7 for spraying the fluid 20 onto the semiconductor device 5.

When the electrical characteristic of the semiconductor device 5 is to be evaluated by the contact probe 10, accordingly, the fluid 20 is sprayed onto the semiconductor device 5 by the fluid spraying portion 7. Consequently, it is possible to easily prevent the partial discharge from occurring in the evaluation. Therefore, it is possible to enhance yield of the semiconductor device 5.

It is sufficient that the fluid 20 is sprayed onto the semiconductor device 5. For this reason, it is not necessary to tightly seal the measurement space in which the contact probe 10 and the semiconductor device 5 are provided. Moreover, it is not necessary to carry out additional processing for filling with the fluid 20 every evaluation or removing the fluid 20 from the semiconductor device 5 after the evaluation. Consequently, it is possible to reduce a cost and to prevent a time required for the evaluating process from being increased.

There is further provided the fluid sucking portion 17. The fluid sucking portion 17 is disposed in the opposed position to the fluid spraying portion 7 and serves to suck the fluid 20 sprayed by the fluid spraying portion 7. Therefore, it is possible to prevent the sprayed fluid 20 from scattering, and furthermore, to suppress the pressurization of the measurement space.

There is further provided the insulating substrate 16 for installing the contact probe 10 thereon, and the fluid spraying portion 7 is disposed on the insulating substrate 16. By approaching the semiconductor device 5 to be an evaluation target to spray the fluid 20 thereonto, therefore, it is possible to enhance the effect for suppressing the partial discharge.

There is further provided the insulating substrate 16 for installing the contact probe 10, and the fluid spraying portion 7 and the fluid sucking portion 17 are disposed on the insulating substrate 16. By approaching the semiconductor device 5 to be the evaluation target to spray the fluid 20 thereonto, therefore, it is possible to enhance the effect for suppressing the partial discharge. By carrying out approach to suck the fluid 20, moreover, it is possible to efficiently prevent the sprayed fluid 20 from scattering, and furthermore, to efficiently suppress the pressurization of the measurement space.

There is further provided the control unit 4 for starting to spray the fluid 20 by the fluid spraying portion 7 simultaneously with the start of the evaluation for the electrical characteristic of the semiconductor device 5. By spraying the fluid 20 during only the evaluation, therefore, it is possible to simplify the process, and furthermore, to reduce the cost.

The fluid 20 to be sprayed by the fluid spraying portion 7 is a sulfur hexafluoride gas, a carbon dioxide gas or a nitrogen gas. Therefore, it is possible to enhance the effect for suppressing the partial discharge.

The fluid spraying portion 7 is provided in such a manner that the fluid 20 can be sprayed onto the whole surface of the semiconductor device 5. Therefore, it is possible to efficiently spray the fluid 20.

Here, the fluid spraying portion 7 may include a nozzle. In other words, a spraying port of the fluid spraying portion 7 may be formed to take a shape of the nozzle and may have a structure in which the fluid 20 is jetted at a high speed and reliably spreads over the front surface of the semiconductor device 5. In this case, it is possible to efficiently spray the fluid 20 onto a target position in the semiconductor device 5.

Moreover, the sucking port of the fluid sucking portion 17 may be wide, that is, may be formed as a cone-shaped sucking port to enhance sucking performance for the fluid 20. Although FIG. 3 shows the example in which the single fluid spraying portion 7 and the single fluid sucking portion 17 are disposed respectively, furthermore, the present invention is not restricted thereto but it is also possible to employ a structure in which the plurality of fluid spraying portions 7 and the plurality of fluid sucking portions 17 are disposed to regulate the atmospheric concentration of the fluid 20 wholly or partially (for example, FIG. 4 which will be described below).

It is known that the partial discharge often occurs in a peripheral region of an outer edge portion in which a termination portion is formed in addition to a central region constituting an element portion to be an active region with which the contract probe 10 comes in contact in the semiconductor device 5. For this reason, it is supposed that a region onto which the fluid 20 is to be sprayed is specialized into only the outer edge portion.

Figure 4:
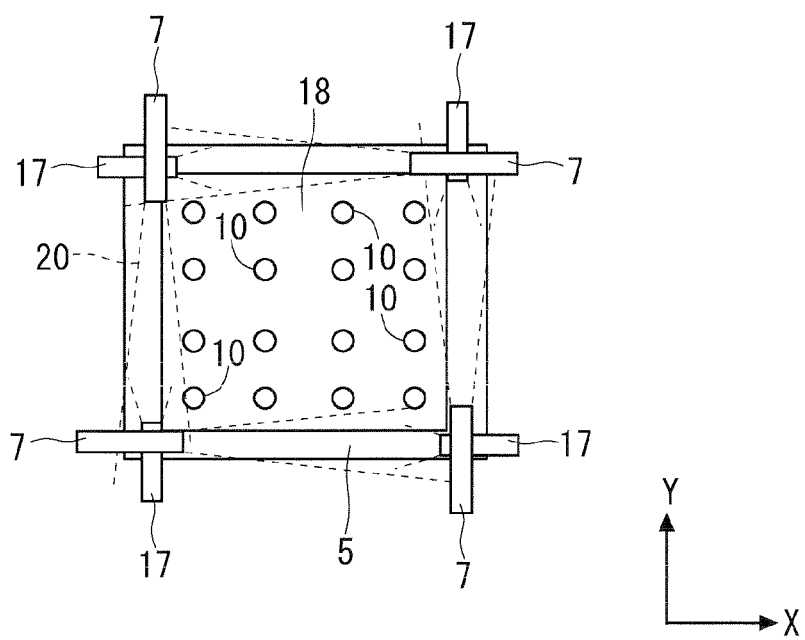
FIG. 4 is a plan view showing a structure in which a fluid spraying portion and a fluid sucking portion are disposed in a semiconductor evaluating device according to a first variant of the first preferred embodiment.

FIG. 4 is a plan view showing a structure in which the fluid spraying portion 7 and the fluid sucking portion 17 are disposed in the semiconductor evaluating device 1 according to a first variant of the first preferred embodiment, and the insulating substrate 16 is omitted for easy understanding of the drawing. In order to specialize the region onto which the fluid 20 is to be sprayed into only the outer edge portion, four fluid spraying portions 7 are disposed in corresponding positions to four corner portions of the semiconductor device 5 in the insulating substrate 16 respectively, and four fluid sucking portions 17 are disposed in corresponding positions to the opposed corner portions to the corner portions of the semiconductor device 5 in which the fluid spraying portions 7 are provided in the insulating substrate 16 respectively.

In FIG. 4, the fluid spraying portion 7 and the fluid sucking portion 17 are shown to overlap with each other. As shown in FIG. 1, however, the fluid spraying portion 7 sprays the fluid 20 from obliquely above the semiconductor device 5 toward the outer edge portion on one of sides of the semiconductor device 5, and the fluid sucking portion 17 sucks the fluid 20 in the vicinity of the front surface of the semiconductor device 5. Consequently, height positions in which the fluid spraying portion 7 and the fluid sucking portion 17 are to be provided are different from each other. For this reason, in the disposition, the fluid spraying portion 7 and the fluid sucking portion 17 do not interfere with each other. The fluid spraying portion 7 is provided in such a manner that the fluid 20 can be sprayed onto the outer edge portion of the semiconductor device 5. Therefore, it is possible to particularly prevent the partial discharge from often occurring in the vicinity of the termination portion of the semiconductor device 5.

Figure 5:
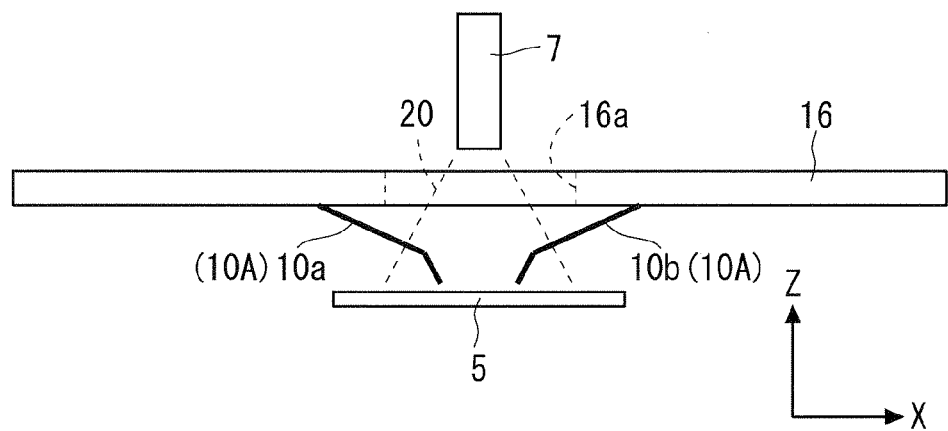
FIG. 5 is a front view showing a structure in which a fluid spraying portion is disposed in a semiconductor evaluating device according to a second variant of the first preferred embodiment.

Although the description has been given to the contact probe of the spring type having a sliding property in a Z-axis direction, moreover, the present invention is not restricted thereto but a contact probe of a cantilever type may be employed (for example, the structure shown in FIG. 5). The contact probe having the sliding property in the Z-axis direction is not restricted to the spring type but may be a lamination probe, a wire probe or the like.

Brief description will be given to the case in which a contact probe 10A of a cantilever type is used. FIG. 5 is a front view showing a structure in which the fluid spraying portion 7 is disposed in the semiconductor evaluating device 1 according to a second variant of the first preferred embodiment. A printed circuit board is employed as the insulating substrate 16. Probe pins 10a and 10b constituting the contact probe 10A are fixed to a lower surface of the insulating substrate 16 at a predetermined interval in an inclining state with respect to the vertical direction (the Z direction), respectively. More specifically, base ends of the probe pins 10a and 10b are fixed to an outer peripheral part of a bored portion 16a formed on the insulating substrate 16, and the semiconductor device 5 is provided on tip sides of the probe pins 10a and 10b. The fluid spraying portion 7 is disposed on an upper side of the bored portion 16a, and the fluid spraying portion 7 sprays the fluid 20 onto the whole front surface of the semiconductor device 5 through the bored portion 16a.

Moreover, it is desirable that a temperature of the fluid 20 should be almost coincident with that of the semiconductor device 5 in the evaluation. As the evaluation for the semiconductor device 5, a temperature characteristic is evaluated. In some cases, therefore, the temperature ranges from a low temperature to a high temperature, more specifically, approximately −40° C. to +200° C., for example. For this reason, In the case where the temperature of the fluid 20 which is to be given in the evaluation is different from that of the semiconductor device 5, the fluid 20 is sprayed so that the temperature of the semiconductor device 5 becomes unstable. As a result, desirable evaluation for the temperature characteristic cannot be obtained.

Figure 6:
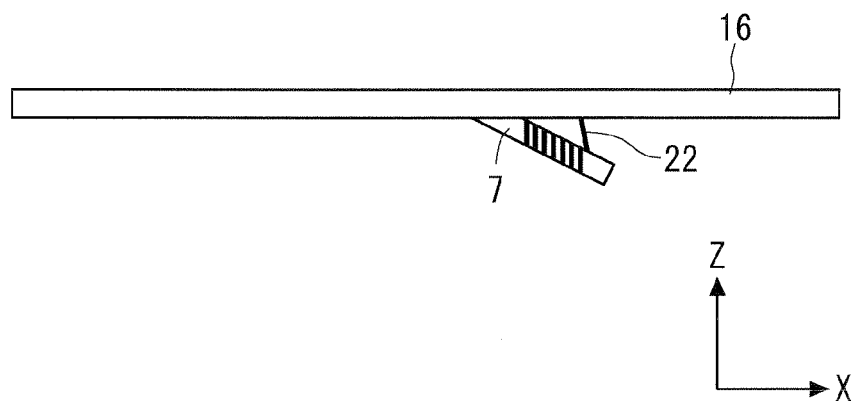
FIG. 6 is a front view showing a structure in which a fluid spraying portion is disposed in a semiconductor evaluating device according to a third variant of the first preferred embodiment.

Therefore, FIG. 6 shows an example in which a first temperature control portion is added to the fluid spraying portion 7. FIG. 6 is a front view showing a structure in which the fluid spraying portion 7 is disposed in the semiconductor evaluating device 1 according to a third variant of the first preferred embodiment. As the first temperature control portion for controlling the temperature of the fluid 20, there is provided a heater portion 22 which is obtained by winding a heating wire like a coil upon the nozzle of the fluid spraying portion 7. A current is applied to the heater portion 22 to control the temperature of the fluid spraying portion 7, and furthermore, the temperature of the fluid 20 to be sprayed into a desirable value. Consequently, it is possible to suppress the instability of the temperature of the semiconductor device 5 which is caused by spraying the fluid 20.

For example, In the case where the heater portion 22 controls the temperature of the fluid 20 to be equal to that of the semiconductor device 5 at the time of the evaluation for the electrical characteristic of the semiconductor device 5, it is possible to suppress the instability of the temperature of the semiconductor device 5 still more by spraying the fluid 20. Although the heater portion 22 is shown as an example of the first temperature control portion, the present invention is not restricted thereto but it is also possible to carry out heating by using a heater portion obtained by winding a near infrared wire like a coil. Moreover, it is also possible to employ a structure for taking a countermeasure against a low temperature by adding a Peltier element.

In the case where the fluid spraying is specialized into the outer edge portion of the semiconductor device 5 as shown in FIG. 4, it is also possible to employ a structure in which a shielding portion is provided between an element portion and an outer edge portion in such a manner that the element portion is not influenced by the temperature of the fluid 20. FIG. 7 is a plan view showing a structure in which the fluid spraying portion 7 and the fluid sucking portion 17 are disposed in the semiconductor evaluating device 1 according to a fourth variant of the first preferred embodiment. The insulating substrate 16 is omitted for easy understanding of the drawing, and the fluid spraying portion 7 and the fluid sucking portion 17 are shown only in the outer edge portion on one of the sides in the semiconductor device 5.

The shielding portion 23 is formed in such a way as to take a shape of a frame as seen on a plane and is provided in a corresponding position to the outer edge portion of the semiconductor device 5 in the insulating substrate 16 in order to surround the element portion of the semiconductor device 5. The fluid spraying portion 7 is disposed in a corresponding position to a predetermined corner portion of the semiconductor device 5 in the insulating substrate 16, and the fluid sucking portion 17 is disposed in a corresponding position to an opposed corner portion to the corner portion of the semiconductor device 5 in which the fluid spraying portion 7 is provided in the insulating substrate 16.

For this reason, the flow of the fluid 20 sprayed by the fluid spraying portion 7 from the outer edge portion of the semiconductor device 5 into an inside of the outer edge portion of the semiconductor device 5 is shielded by the shielding portion 23 and is generally sprayed onto the outer edge portion of the semiconductor device 5. The insulating substrate 16 is provided with the shielding portion 23 for shielding the flow of the fluid 20 sprayed by the fluid spraying portion 7 from the outer edge portion of the semiconductor device 5 into the inside of the outer edge portion of the semiconductor device 5. Therefore, it is possible to prevent the fluid 20 from being sprayed onto the element portion of the semiconductor device 5. Thus, it is possible to suppress a variation in temperature of the element portion of the semiconductor device 5.

The shielding portion 23 is formed by a metal plate or an insulator, for example. For this reason, In the case where the shielding portion 23 is formed by the metal plate, processing is easy to perform, and furthermore, a heat moving effect is enhanced. In the case where the shielding portion 23 is formed by the insulator, a heat capacity is large and a heat shielding effect is excellent.

In order to maintain the temperature of the shielding portion 23 and that of the element portion to be almost equal to each other, moreover, it is also possible to provide, in the shielding portion 23, a second temperature control portion for controlling the temperature of the shielding portion 23. In this case, it is possible to apply, as the second temperature control portion, a structure in which a heater portion obtained by winding a heating wire or a near infrared wire like a coil and a Peltier element are added in the same manner as in the first temperature control portion. In the case where the shielding portion 23 is provided with the second temperature control portion for controlling the temperature of the shielding portion 23, it is possible to suppress a variation in temperature of the element portion, thereby enhancing the heat shielding effect by setting the temperature of the fluid 20 to be almost equal to that of the element portion through the second temperature control portion also when the fluid 20 passes through the shielding portion 23 and thus flows into the element portion of the semiconductor device 5.

Moreover, the number of the shielding portions 23 is not restricted to be one but may be disposed in double or triple, for example, on the outer peripheral side of the shielding portion 23 in order to maintain the temperature of the element portion of the semiconductor device 5 with high precision so as not to be influenced by the temperature of the fluid 20.

In addition, a shielding portion 24 may be provided on a plurality of contact probes 10 disposed at an outermost peripheral side as shown in FIG. 8. FIG. 8 is a plan view showing a structure in which the fluid spraying portion 7 and the fluid sucking portion 17 are disposed in the semiconductor evaluating device 1 according to a fifth variant of the first preferred embodiment. The fluid spraying portion 7 and the fluid sucking portion 17 are provided in the same positions as those in FIG. 7. Also in this case, it is possible to prevent the fluid 20 from being sprayed onto the element portion of the semiconductor device 5 by the shielding portion 24. Consequently, it is possible to prevent the temperature of the element portion from being varied.

Second Preferred Embodiment

Figure 9:
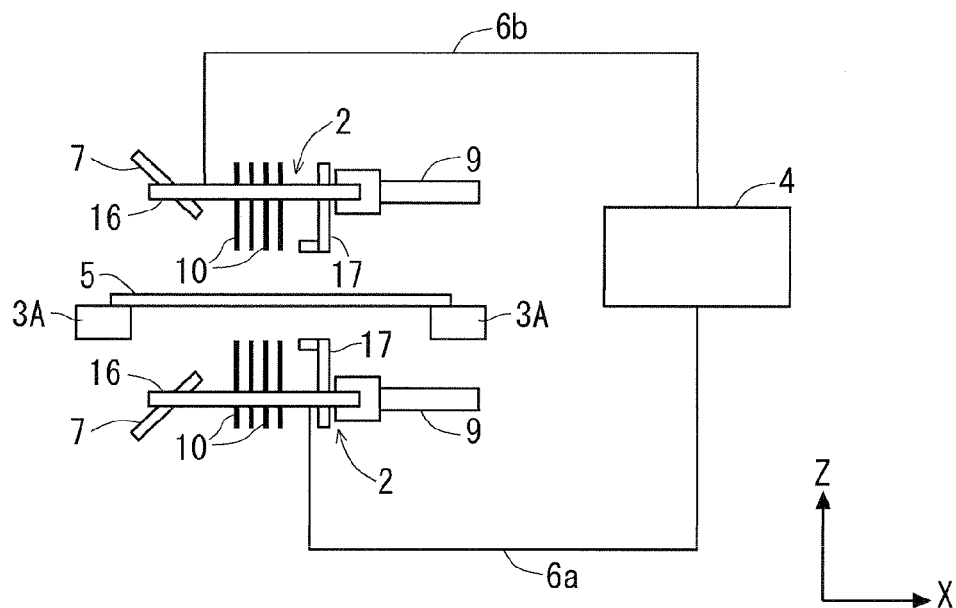
FIG. 9 is a schematic view showing a semiconductor evaluating device according to a second preferred embodiment.

Next, a semiconductor evaluating device 1A according to a second preferred embodiment will be described. FIG. 9 is a schematic view showing the semiconductor evaluating device 1A according to the second preferred embodiment, illustrating the semiconductor evaluating device 1A having a so-called double-sided probe structure in which a contact probe 10 is caused to come in contact from both front and back surfaces of a semiconductor device 5. In the second preferred embodiment, the same components as those described in the first preferred embodiment have the same reference numerals and description will be omitted.

The semiconductor evaluating device 1A includes a probe substrate 2, a fluid spraying portion 7, a fluid sucking portion 17 and a moving arm 9 which are provided on the front surface side and the back face side of the semiconductor device 5, respectively, a control unit 4, and a chuck stage 3A for fixing both ends in an X direction of the semiconductor device 5, respectively. Although FIG. 9 shows an example in which the semiconductor device 5 is provided in a horizontal direction (the X direction), the present invention is not restricted thereto but the semiconductor device 5 may be disposed in a vertical direction (in a Z direction).

As described above, in the semiconductor evaluating device 1A according to the second preferred embodiment, the contact probe 10 and the fluid spraying portion 7 are provided on the both front and back surface sides of the semiconductor device 5. Therefore, it is possible to spray a fluid onto the whole front and back surfaces of the semiconductor device 5. Consequently, it is also possible to prevent a partial discharge from occurring in the back surface of the semiconductor device 5 in addition to the front surface thereof.

Moreover, the fluid sucking portion 17 for sucking a fluid 20 sprayed by the fluid spraying portion 7 is provided in each of positions opposed to the fluid spraying portion 7 on both front and back surface sides of the semiconductor device 5. Also at the back surface of the semiconductor device 5 in addition to the front surface thereof, therefore, it is possible to suck the fluid 20, to efficiently prevent the sprayed fluid 20 from scattering, and furthermore, to efficiently suppress pressurization of a measurement space.

Third Preferred Embodiment

Figure 10:
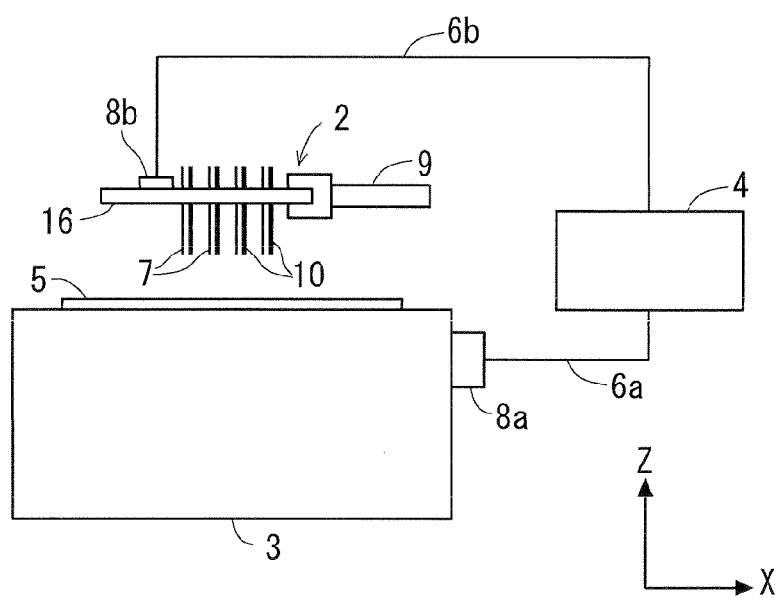
FIG. 10 is a schematic view showing a semiconductor evaluating device according to a third preferred embodiment.
Figure 11:
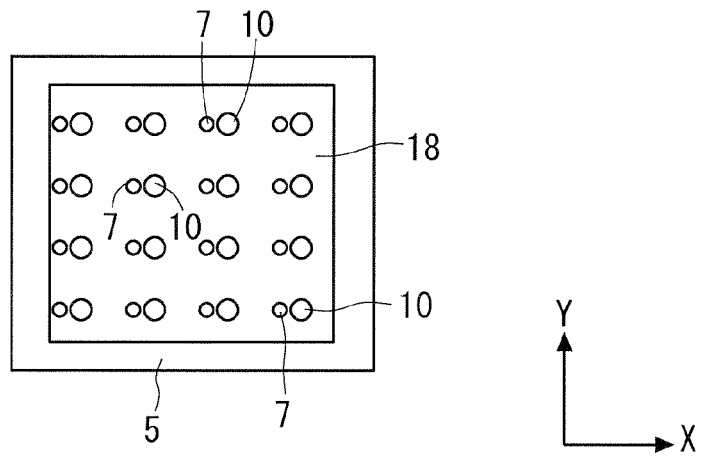
FIG. 11 is a plan view showing a structure in which a fluid spraying portion is disposed in the semiconductor evaluating device according to the third preferred embodiment.
Figure 12:
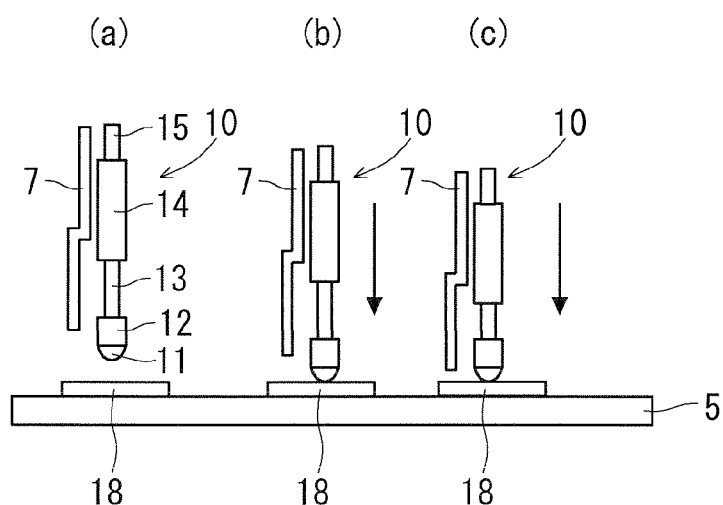
FIG. 12 is a view for explaining an operation of a contact probe in the semiconductor evaluating device according to the third preferred embodiment.

Next, a semiconductor evaluating device 1B according to a third preferred embodiment will be described. FIG. 10 is a schematic view showing the semiconductor evaluating device 1B according to the third preferred embodiment. FIG. 11 is a plan view showing a structure in which a fluid spraying portion 7 is disposed in the semiconductor evaluating device 1B according to the third preferred embodiment. For easy understanding of the drawing, an insulating substrate 16 is omitted. FIG. 12 is a view for explaining an operation of a contact probe 10 in the semiconductor evaluating device 1B according to the third preferred embodiment, and part (a) of FIG. 12 shows an initial state, part (b) of FIG. 12 shows a contact state and part (c) of FIG. 12 shows a pressing state. In the third preferred embodiment, the same components as those described in the first and second preferred embodiments have the same reference numerals and description will be omitted.

As shown in FIGS. 10 and 11, in the semiconductor evaluating device 1B, the fluid spraying portions 7 are provided in adjacent positions to the contact probes 10, respectively, in a downward direction (in a –Z direction) in the insulating substrate 16. The fluid spraying portion 7 includes a nozzle and serves to spray a fluid 20 in the downward direction (in the –Z direction). The fluid spraying portions 7 are provided in order to spray the fluid 20 onto the whole front surface of the semiconductor device 5.

As shown in part (a) of FIG. 12, in the initial state, a tip of the nozzle of the fluid spraying portion 7 has a height which is not equal to that of a contact portion 11 serving as a tip portion of the contact probe 10. More specifically, the tip of the nozzle of the fluid spraying portion 7 is positioned above the contact portion 11. The contact portion 11 comes in contact with a connecting pad 18 as shown in part (b) of FIG. 12, and the tip of the nozzle is then positioned in the vicinity of an upper surface of the connecting pad 18 in the pressing state brought by the contact portion 11 shown in part (c) of FIG. 12. In particular, the contact probe 10 and the fluid spraying portion 7 are provided to leave an interval in a horizontal direction (in an X direction) in such a manner that the contact portion 11 and the nozzle do not come in contact with each other.

As described above, in the semiconductor evaluating device 1B according to the third preferred embodiment, the fluid spraying portion 7 is disposed in an adjacent position to the contact probe 10 in the insulating substrate 16. Therefore, it is possible to selectively prevent a partial discharge from occurring in the vicinity of the contact probe 10.

Figure 13:
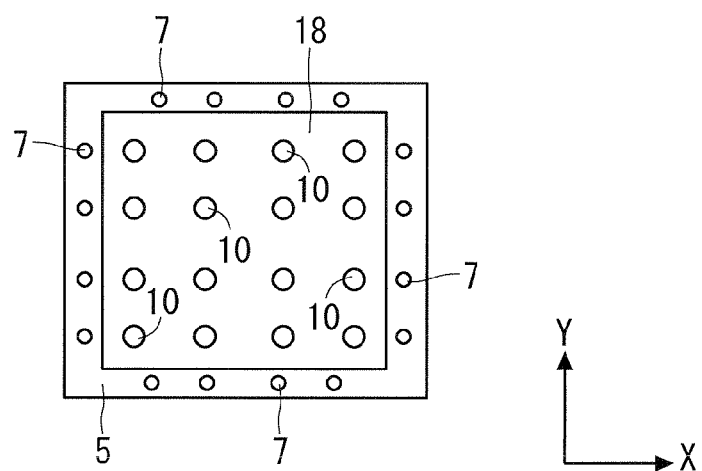
FIG. 13 is a plan view showing a structure in which a fluid spraying portion is disposed in a semiconductor evaluating device according to a first variant of the third preferred embodiment.

Moreover, it is known that the partial discharge occurs in the vicinity of a peripheral edge portion in which a termination portion is formed in addition to a central region (an element portion) with which the contact probe 10 comes in contact in the semiconductor device 5. FIG. 13 is a plan view showing a structure in which the fluid spraying portion 7 is disposed in a semiconductor evaluating device according to a first variant of the third preferred embodiment. For easy understanding of the drawing, the insulating substrate 16 is omitted. In the present variant, the fluid spraying portion 7 is especially provided in a corresponding position to the peripheral edge portion of the semiconductor device 5 in the insulating substrate 16, and four fluid spraying portions 7 are disposed in corresponding positions to respective sides of the semiconductor device 5 in the insulating substrate 16. Furthermore, the fluid spraying portion 7 is disposed in a downward direction (a –Z direction) in the insulating substrate 16 in the same manner as in the case of FIG. 11. The number of the fluid spraying portions 7 to be disposed in the corresponding positions to the respective sides of the semiconductor device 5 in the insulating substrate 16 is not restricted to be four but may be varied depending on a size of the semiconductor device 5 or precision of measurement.

While the invention has been shown and described in detail, the foregoing description is in all aspects illustrative and not restrictive. It is therefore understood that numerous modifications and variations can be devised without departing from the scope of the invention.

What is claimed is:

1. A semiconductor evaluating device comprising:
   a chuck stage for holding a measuring object;
   a contact probe for evaluating an electrical characteristic of said measuring object held on said chuck stage in contact with said measuring object; and
   a fluid spraying portion for spraying a fluid onto said measuring object;
   wherein said contact probe and said fluid spraying portion are provided on both front and back surface sides of said measuring object.

2. The semiconductor evaluating device according to claim 1, further comprising a fluid sucking portion, provided in an opposed position to said fluid spraying portion, for sucking a fluid sprayed by said fluid spraying portion.

3. The semiconductor evaluating device according to claim 1, further comprising an insulating substrate for disposing said contact probe, wherein
   said fluid spraying portion is provided on said insulating substrate.

4. The semiconductor evaluating device according to claim 2, further comprising an insulating substrate for disposing said contact probe, wherein
   said fluid spraying portion and said fluid sucking portion are provided on said insulating substrate.

5. The semiconductor evaluating device according to claim 3, wherein said fluid spraying portion is disposed in an adjacent position to said contact probe in said insulating substrate.

6. The semiconductor evaluating device according to claim 1, further comprising a control unit for starting to spray a fluid by said fluid spraying portion simultaneously with start of evaluation for an electrical characteristic of said measuring object.

7. The semiconductor evaluating device according to claim 1, wherein said fluid spraying portion includes a nozzle.

8. The semiconductor evaluating device according to claim 1, wherein said fluid spraying portion is provided so as to enable a fluid to be sprayed onto a whole front surface of said measuring object.

9. The semiconductor evaluating device according to claim 1, wherein said fluid spraying portion is provided so as to enable a fluid to be sprayed onto an outer edge portion of said measuring object.

10. The semiconductor evaluating device according to claim 1, wherein a fluid sucking portion for sucking a fluid sprayed by said fluid spraying portion is provided in each of opposed positions to said fluid spraying portion on the both front and back surface sides of said measuring object.

11. The semiconductor evaluating device according to claim 1, wherein a fluid to be sprayed by said fluid spraying portion is a sulfur hexafluoride gas, a carbon dioxide gas or a nitrogen gas.

12. The semiconductor evaluating device according to claim 7, wherein said nozzle is provided with a first temperature control portion for controlling a temperature of a fluid to be sprayed by said fluid spraying portion.

13. The semiconductor evaluating device according to claim 12, wherein said first temperature control portion controls a temperature of a fluid into an equal temperature to a temperature of said measuring object at a time of evaluation of an electrical characteristic of said measuring object.

14. The semiconductor evaluating device according to claim 9,
wherein said contact probe or an insulating substrate for disposing said contact probe is provided with a shielding portion for shielding a flow of a fluid sprayed by said fluid spraying portion from the outer edge portion of said measuring object into an inside of the outer edge portion of said measuring object.

15. The semiconductor evaluating device according to claim 14, wherein said shielding portion is formed by a metal plate.

16. The semiconductor evaluating device according to claim 14, wherein said shielding portion is formed by an insulator.

17. The semiconductor evaluating device according to claim 14, wherein said shielding portion is provided with a second temperature control portion for controlling a temperature of the shielding portion.

18. A semiconductor evaluating method using a semiconductor evaluating device that includes a chuck stage for holding a measuring object, a contact probe for evaluating an electrical characteristic of said measuring object held on said chuck stage in contact with said measuring object, and a fluid spraying portion for spraying a fluid onto said measuring object, wherein said contact probe and said fluid spraying portion are provided on both front and back surface sides of said measuring object, the method comprising the steps of:
electrically evaluating said measuring object by causing said contact probe to come in contact with said measuring object; and
spraying a fluid onto a front surface of said measuring object by said fluid spraying portion in the step of electrically evaluating said measuring object.

19. The semiconductor evaluating method according to claim 18: wherein the semiconductor evaluating device further includes a fluid sucking portion, provided in an opposed position to said fluid spraying portion, for sucking a fluid sprayed by said fluid spraying portion, the method further comprising the steps of:
sucking the fluid sprayed in the step of spraying a fluid onto a front surface of said measuring object by said fluid sucking portion.

* * * * *